United States Patent [19]
Faber

[11] Patent Number: 5,710,983
[45] Date of Patent: Jan. 20, 1998

[54] CHANNEL SELECTING SYSTEM UTILIZING A RANDOM NUMBER GENERATOR HAVING A SHIFT REGISTER, SWITCHES AND BOOLEAN FUNCTION CIRCUIT TO RANDOMLY SELECT A CHANNEL FREQUENCY

[75] Inventor: Ulrich Faber, Tokyo, Japan

[73] Assignee: NEC Corporation, Tokyo, Japan

[21] Appl. No.: 648,956

[22] Filed: May 16, 1996

[30] Foreign Application Priority Data

May 16, 1995 [JP] Japan ............................... 7-117162

[51] Int. Cl.⁶ ......................................................... H04B 1/40
[52] U.S. Cl. ..................... 455/76; 455/165.1; 455/183.1; 331/1 R
[58] Field of Search .................... 455/62, 76, 77, 455/165.1, 183.1, 196.1, 260; 331/1 R, 1 A

[56] References Cited

U.S. PATENT DOCUMENTS 3,944,925  3/1976  De Laune ................................. 325/17
5,450,621  9/1995  Kianush et al. ...................... 455/192.2
5,452,319  9/1995  Cook et al. ............................ 375/202
5,515,364  5/1996  Fague .................................... 370/29

FOREIGN PATENT DOCUMENTS 0023039   3/1980  Japan .................................. 455/183.1
60-14534  1/1985  Japan .
2-206917  8/1990  Japan .

OTHER PUBLICATIONS

Butler, Pseud–Random binary sequence generators, Wirless World, pp. 87–92, Feb. 1975.

*Primary Examiner*—Andrew Faile
*Assistant Examiner*—Vincent F. Boccio
*Attorney, Agent, or Firm*—Foley & Lardner

[57] ABSTRACT

Frequency-dividing ratio data for selecting the oscillating frequency of a synthesizer are generated by a shift register, a certain number of switches connected to respective output terminals of the shift register, and an exclusive-OR gate for exclusive-ORing output signals respectively from the switches and feeding an output signal back to an input terminal of the shift register. A memory stores initial settings for the shift register and open and closed states of the switches.

8 Claims, 5 Drawing Sheets

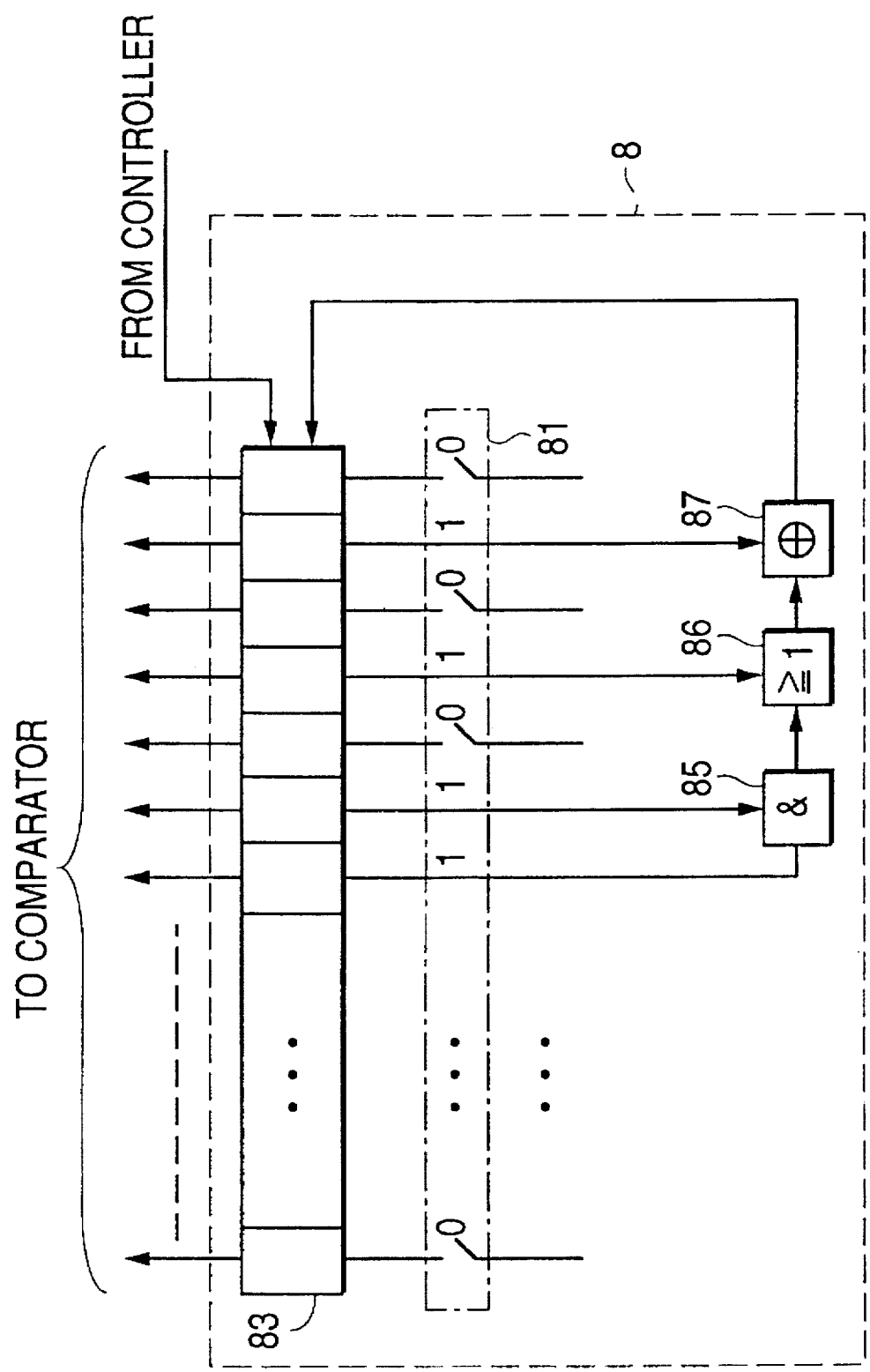

CHANNEL SELECTING SYSTEM UTILIZING A RANDOM NUMBER GENERATOR HAVING A SHIFT REGISTER, SWITCHES AND BOOLEAN FUNCTION CIRCUIT TO RANDOMLY SELECT A CHANNEL FREQUENCY

BACKGROUND OF THE INVENTION

1. Field of the Invention

The present invention relates to a channel selecting system for selecting channels for a pilot signal in a communication device.

2. Description of the Related Art

Pilot signals for use in amplifying carrier signals in transmission devices are used in distortion compensating circuits which compensate for a distortion that is caused due to non-linearity of the amplifier. A pilot signal in a channel tends to be affected by noise and distortions of other channels because of the characteristics of a transmission path for the pilot signal and the temperature-dependent characteristics of related circuits. For protecting the pilot signal from such noise and distortions of other channels to improve compensating capabilities of the distortion compensating circuit, it is necessary to change the channel of the pilot signal, i.e., to change the frequency of the pilot signal. The channel of the pilot signal may be changed by changing pilot signal channels in a predetermined sequence. However, it is preferable to change the channel of the pilot signal randomly for minimizing adverse effects due to distortions of other channels, on account of a random assignment of a channel to the carrier signal.

It has heretofore been proposed to generate a random signal with a noise signal generator, convert the random signal into a pulse train with a pulse generator, apply the pulse train to a shift register to generate random data, and select a channel randomly based on the random data. According to another channel selecting system which has also been proposed, channel data arranged in a random sequence which are stored in a ROM are successively read from the ROM, and a channel is selected according to the channel data which are read from the ROM.

One conventional channel selecting system is shown in FIG. 1 of the accompanying drawings. The channel selecting system shown in FIG. 1 comprises a synthesizer 11 for generating a pilot signal, a noise signal generator 14 for generating a noise signal, a pulse generator 13 for converting the noise signal into a train of pulses, a shift register 15 for storing the train of pulses from the pulse generator 13 and outputting parallel data composed of a certain numbers of bits of the shift register 13, a comparator 16 for deciding whether the oscillating frequency of the synthesizer 11 falls in a predetermined frequency band or not based on the parallel data outputted from the shift register 15, a matching circuit 17 for matching a signal depending on the type of the synthesizer 11, and a controller 12 for controlling the synthesizer 11, the pulse generator 13, the noise signal generator 14, the shift register 15, the comparator 16, and the matching circuit 17 according to a channel change request signal Ic outputted from a control means (not shown).

The synthesizer 11 comprises a PLL (phase-locked loop) circuit including a phase comparator, an LPF (low-pass filter), a VCO (voltage-controlled oscillator), and a programmable frequency divider, none of which is shown. Since the frequency of an output signal from the synthesizer 11 can be varied by varying the frequency-dividing ratio of the programmable frequency divider, the channel of the pilot signal can be changed at random when the frequency-dividing ratio of the programmable frequency divider is established by random data.

When a channel change request signal Ic is outputted from the control means (not shown) to the controller 12, the controller 12 supplies a control signal to the pulse generator 13. In response to the control signal from the controller 12, the pulse generator 13 converts a noise signal from the noise signal generator 14 into a pulse train, and delivers the pulse train to the shift register 15. The shift register 5 stores the pulse train transmitted from the pulse generator 13 until a next control signal is supplied from the controller 12, and outputs the stored data (random data) to the comparator 16 when the next control signal is supplied from the controller 12. The comparator 16 then decides whether the random data outputted from the shift register 15 fall in a predetermined range or not. The predetermined range represents a frequency range of a signal which is to be generated by the synthesizer 11 based on the data.

If the random data outputted from the shift register 15 are judged as falling in the predetermined range, then the random data are converted by the matching circuit 17 into a random data signal in a form (i.e., either a digital signal or an analog signal) to be supplied to the programmable frequency divider of the synthesizer 11, and the converted random data signal is supplied to the sythesizer 11. Based on the random data signal transmitted from the matching circuit 17, the synthesizer 11 generates and outputs a signal having a frequency corresponding to the random data signal.

FIG. 2 of the accompanying drawings shows another conventional channel selecting system. The channel selecting system shown in FIG. 2 comprises a synthesizer 11 in the form of a PLL circuit for generating a pilot signal, a ROM 23 that stores channel data indicative of channels, a matching circuit 27 for matching a signal depending on the type of the synthesizer 21, and a controller 22 for controlling the synthesizer 21, the ROM 23, and the matching circuit 27 according to a channel change request signal Ic outputted from a control means (not shown).

When a channel change request signal Ic outputted from the control means is supplied to the controller 22, the controller 22 applies a control signal to the ROM 23. The channel data stored in the ROM 23 are successively read out according to the control signal, and sent to the matching circuit 27. The matching circuit 27 converts the supplied channel data into a channel data signal in a form (i.e., either a digital signal or an analog signal) to be supplied to the programmable frequency divider of the synthesizer 21, and the converted channel data signal is supplied to the synthesizer 21. Based on the channel data signal transmitted from the matching circuit 27, the synthesizer 21 generates and outputs a signal having a frequency corresponding to the channel data signal.

The channel data stored in the ROM 23 are arranged such that the channels represented by the channel data read from the ROM 23 are of an irregular sequence. Therefore, the signal outputted from the synthesizer 21 seems to have randomly variable frequency.

The conventional channel selecting system with the noise signal generator 14 as shown in FIG. 1 is disadvantageous in that the noise signal generator 14 and the pulse generator 13 are highly expensive. Another problem is that the synthesizer 11 has poor output characteristics because the noise generated by the noise generator 13 may be introduced into the synthesizer 11. Furthermore, the pulse generator 13 and the shift register 15 may possibly output the same random data twice successively, with the result that the channel of the pilot signal may not be varied.

The conventional channel selecting system with the ROM 23 as shown in FIG. 2 is problematic in that the ROM 23 needs a large storage area because the amount of channel data stored in the ROM 23 increases with the number of channels used. If the channel data are stored in a ROM of a one-chip microcomputer, then they may pose a limitation on the storage area of the ROM which is assigned to store other programs.

SUMMARY OF THE INVENTION

It is therefore an object of the present invention to provide a channel selecting system which requires a relatively small data storage memory area and has a relatively simple arrangement for selecting channels for a pilot signal in a communication device.

To achieve the above object, there is provided in accordance with the present invention a channel selecting system comprising a synthesizer for generating a signal in a predetermined frequency range with established data of a frequency-dividing ratio, a random data generator having a shift register having a parallel output terminals, a switch circuit having switches connected respectively to the output terminals of the shift register, and an exclusive-OR gate for exclusive-ORing output signals respectively from the switches and feeding an output signal back to an input terminal of the shift register, to generate data of the frequency-dividing ratio for supplying an output signal from the shift register to randomly select a channel of the synthesizer, and a memory for storing initial settings for the shift register and open and closed states of the switches.

According to the present invention, there is also provided a channel selecting system comprising a synthesizer for generating a signal in a predetermined frequency range with established data of a frequency-dividing ratio, a random data generator having a shift register having a parallel output terminals, a switch circuit having switches connected respectively to the output terminals of the shift register, a Boolean function circuit for being supplied with output signals from the switches, respectively, and an exclusive-OR gate for exclusive-ORing output signals respectively from the switches and an output signal from the Boolean function circuit and feeding an output signal back to an input terminal of the shift register, to generate data of the frequency-dividing ratio for supplying an output signal from the shift register to randomly select a channel of the synthesizer, and a memory for storing initial settings for the shift register and open and closed states of the switches.

In each of the above channel selecting systems, the exclusive-OR gate may be replaced with an exclusive-NOR gate.

The channel selecting system may further comprise a comparator for deciding whether an oscillating frequency of the synthesizer falls in a predetermined frequency range or not, based on output data from the random data generator, a matching circuit for adding a predetermined offset value to output data from the comparator, and outputting a sum signal as either a digital signal or an analog signal to the synthesizer, and a controller for initializing the switch circuit, the shift register, the comparator, and the matching circuit with initial settings stored in the memory, and supplying a control signal to the random data generator to generate next data of the frequency-dividing ratio in response to a channel change request, wherein the memory stores data, as the initial setting for the comparator, for deciding whether the oscillating frequency of the synthesizer falls in a predetermined frequency range or not, and the offset value as the initial setting for the matching circuit.

With the above arrangement, a first channel is selected by the initial setting stored in the memory for the shift register, and output terminals of the shift register are connected to an input terminal of the exclusive-OR gate when open and closed states of the switches are selected by the initial setting stored in the memory for the switches.

An output signal from the exclusive-OR gate is fed back to the input terminal of the shift register to cause the shift register to output pseudonoise having an optional repetitive period. The pseudonoise is supplied as frequency-dividing ratio data to the synthesizer to change the oscillating frequency of the synthesizer at random.

The above and other objects, features, and advantages of the present invention will become apparent from the following description with reference to the accompanying drawings which illustrate examples of the present invention.

BRIEF DESCRIPTION OF THE DRAWINGS

FIG. 6 is a block diagram of a random data generator of a channel selecting system according to a second embodiment of the present invention.

DETAILED DESCRIPTION OF THE PREFERRED EMBODIMENTS

1st Embodiment

Figure 1:
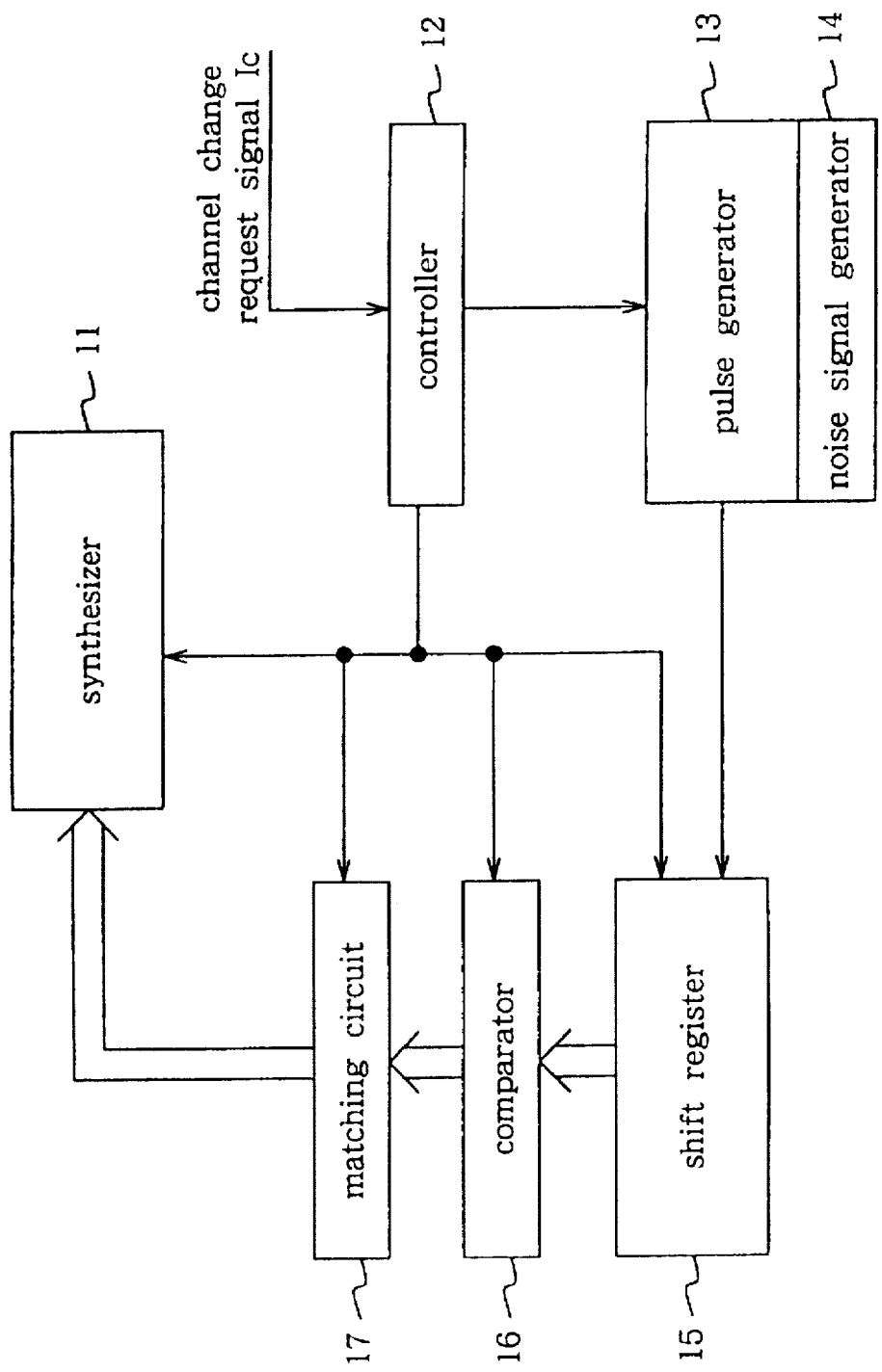
FIG. 1 is a block diagram of a conventional channel selecting system which has a noise signal generator.
Figure 2:
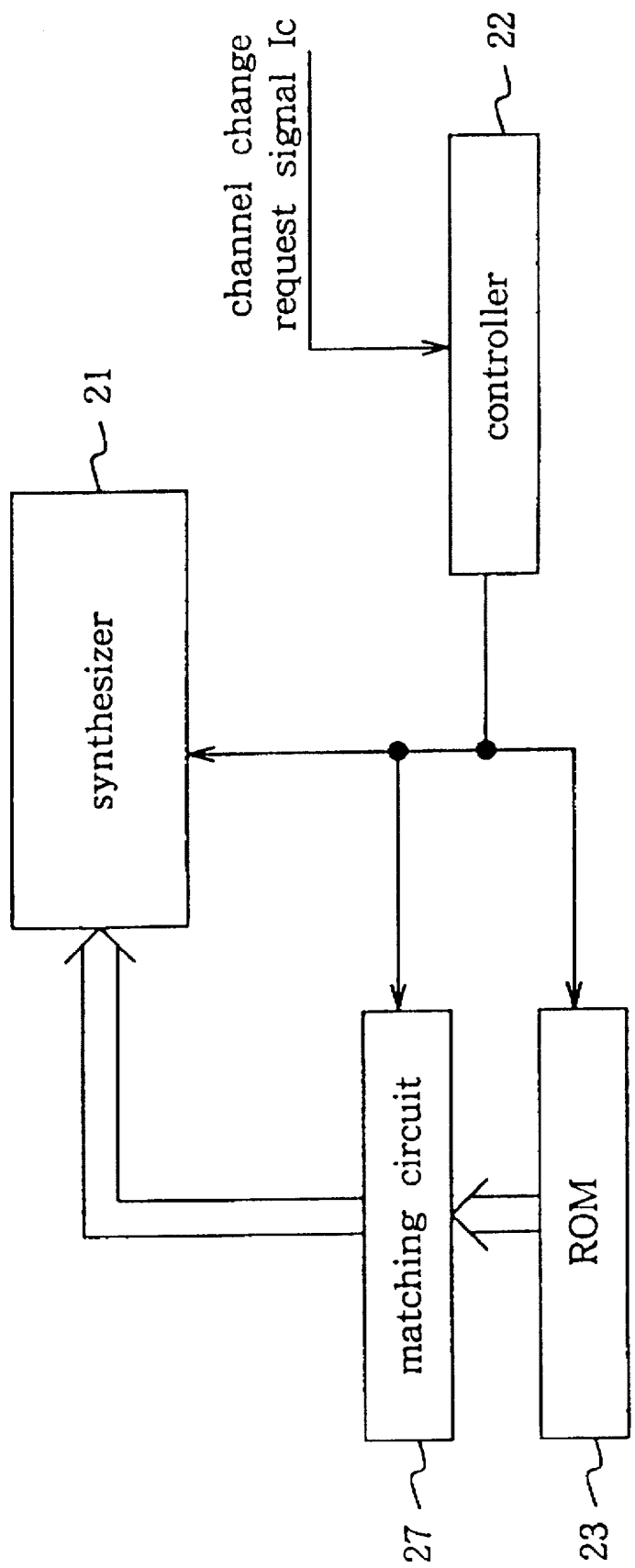
FIG. 2 is a block diagram of a conventional channel selecting system which has a ROM.
Figure 3:
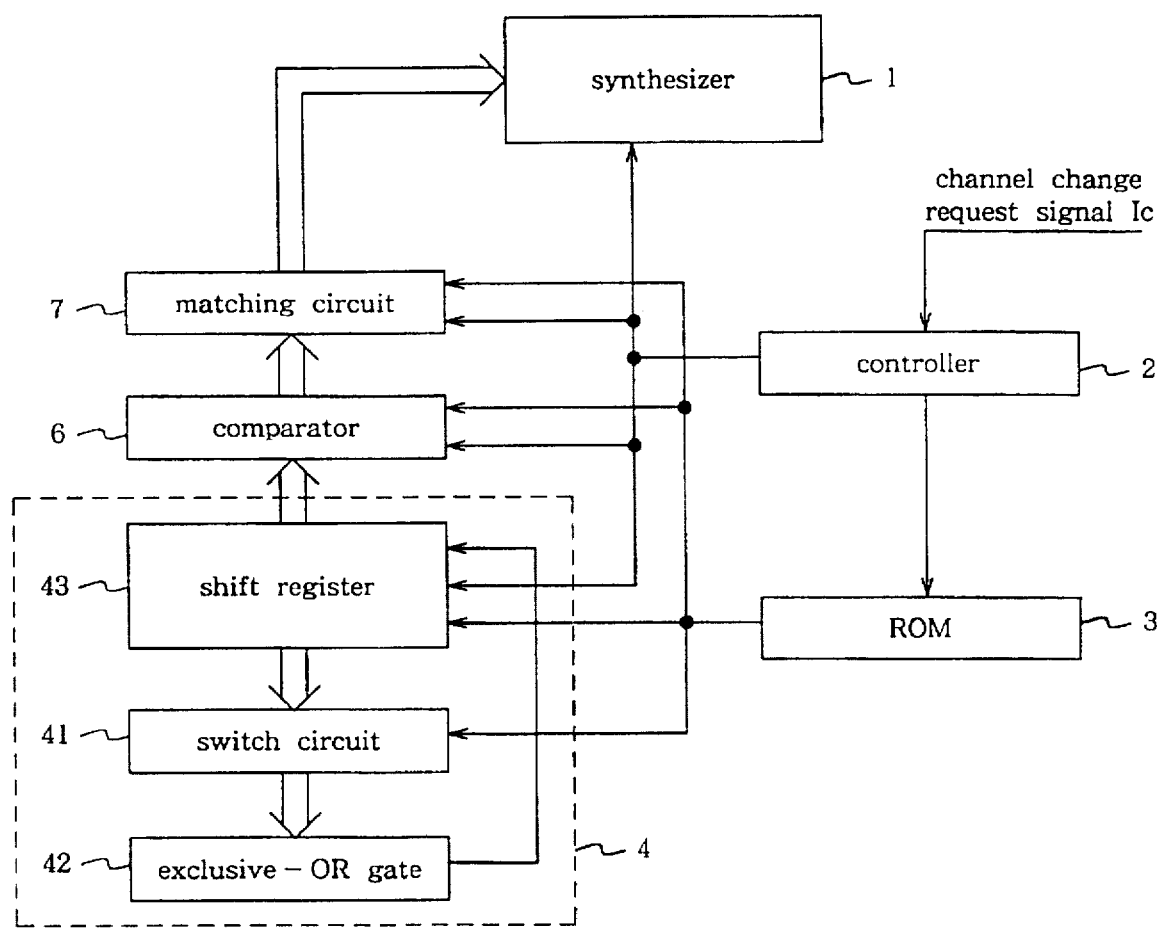
FIG. 3 is a block diagram of a channel selecting system according to a first embodiment of the present invention.

As shown in FIG. 3, a channel selecting system according to a first embodiment of the present invention comprises a synthesizer 1 in the form of a PLL circuit for generating a pilot signal, a random data generator 4 for outputting random data, a comparator 6 for deciding whether the frequency of the pilot signal outputted from the synthesizer 1 falls in a predetermined frequency range or not based on the random data outputted from the random data generator 4, a matching circuit 7 for matching a signal depending on the characteristics of the synthesizer 1, a ROM 3 for storing initializing values of the synthesizer 1, the random data generator 4, the comparator 6, and the matching circuit 7, and a controller 2 for controlling the synthesizer 1, the random data generator 4, the comparator 6, the matching circuit 7, and the ROM 3 according to a channel change request signal Ic outputted from a control means (not shown).

Figure 4:
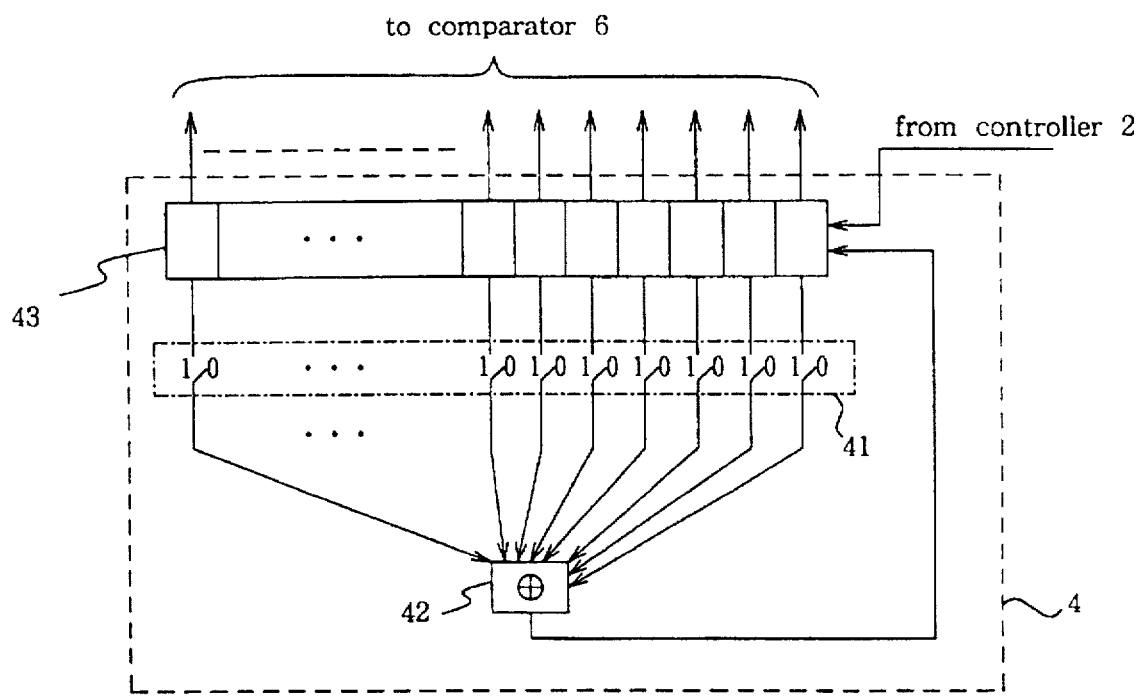
FIG. 4 is a block diagram of a random data generator of the channel selecting system shown in FIG. 3.

As shown in FIG. 4, the random data generator 4 comprises a shift register 43 for shifting, one bit at a time, data inputted according to a control signal from the controller 2 thereby to convert the data into parallel data composed of plural bits and output the parallel data, a switch circuit 41 comprising a certain number of switches connected respectively to output terminals of the shift register 43, and a multiple-input exclusive-OR (EXOR) gate 42 for EXORing output signals from the respective switches of the switch circuit 41.

Figure 5:
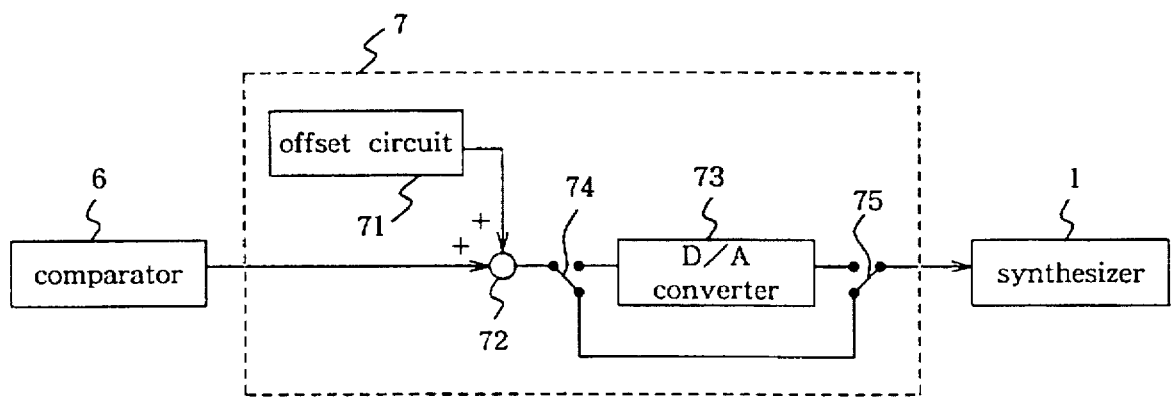
FIG. 5 is a block diagram of a matching circuit of the channel selecting system shown in FIG. 3.

As shown in FIG. 5, the matching circuit 7 comprises an offset circuit 71 for storing an offset value which is established when it is initialized, an adder 72 for adding an output signal from the offset circuit 71 and an output signal from the comparator 6, a D/A converter 73 for converting a digital output signal from the adder 72 into an analog signal, and switches 74, 75 for selecting the digital output signal from the adder 72 or the analog output signal from the D/A converter 73.

The offset value stored in the offset circuit 71 is added to enable the synthesizer 1 to produce an intermediate frequency in a predetermined frequency range for thereby changing channels at random around a channel corresponding to the offset value in the synthesizer 1.

Operation of the channel selecting system according to this embodiment will be described below.

After the channel selecting system is switched on, the switch circuit 41, the shift register 43, the comparator 6, and the matching circuit 7 are initialized by values stored in the ROM 3 according to a signal from the controller 2. Specifically, the switch circuit 41 is initialized such that the switches thereof are either opened or closed. For example, it is assumed that the shift register 43 has a bit length of 16 bits and the switch circuit 41 comprises 16 switches. If the switch circuit 41 is given data "0000000010001110" ("0" represents an open state and "1" represents a closed state) as an initial setting, then output bits of the shift register 43 which correspond to the closed switches (set to "1") of the switch circuit 41 are connected to the EXOR gate 42.

The shift register 43 is given an initial setting, other than "0000000000000000", as data corresponding to a first channel, i.e., an initial setting with at least one bit set to "1".

The comparator 6 is given an initial setting which comprises data corresponding lower- and upper-limit frequencies of a predetermined frequency range that can be used.

When the switch circuit 41 is thus initialized, output terminals of the shift register 43 are connected to input terminals of the EXOR gate 42, and output data from the EXOR gate 42 are fed back to the shift register 43. The shift register 43 now outputs 16-bit data each time a control signal is transmitted from the controller 2.

The 16-bit data thus generated are called pseudonoise (PN). The pseudonoise is of a periodic nature such that after a certain number of data have successively been produced, the same data as the first data are generated. The generating period (repetitive rate) of the pseudonoise is determined by the highest position of a bit which has been set to "1".

In this embodiment, since the highest position of a bit which has been set to "1" is an 8th bit, the same data as the first data are generated after $2^8-1=255$ data have been generated.

If the shift register 43 is given data "0000000001010101" as an initial setting, then the shift register 43 successively outputs data as shown in Table 1 below, one by one according to a control signal from the controller 2 (only low-order 8 bits are shown, and no high-order 8 bits are used in Table 1).

TABLE 1

| | |
|---|---|
| 1st pseudonoise (initial setting) | 01010101 |
| 2nd pseudonoise | 10101011 |
| 3rd pseudonoise | 01010111 |
| 254th pseudonoise | 11010101 |
| 255th pseudonoise | 10101010 |
| 256th pseudonoise (same as initial setting) | 01010101 |

When a channel change request signal Ic from the control means is supplied to the controller 2 after the initialization, the controller 2 applies a control signal to the random data generator 4, which outputs pseudonoise as output data.

The comparator 6 compares data (upper-limit data) corresponding to the upper-limit frequency of a predetermined frequency range given as an initial setting and also data (lower-limit data) corresponding to the lower-limit frequency of the predetermined frequency range, with the output data from the random data generator 4. If the pseudonoise data from the random data generator 4 exceed the upper-limit data or the lower-limit data, i.e., if the output frequency of the synthesizer 1 falls outside of the predetermined frequency range, then the comparator 6 transmits a signal selecting that the output frequency of the synthesizer 1 falls outside of the predetermined frequency range to the controller 2. The controller 2 then applies a control signal again to the random data generator 4, which generates next pseudonoise data.

If the pseudonoise data from the random data generator 4 do not exceed the upper-limit data or the lower-limit data, then the pseudonoise data from the random data generator 4 are transmitted as they are to the matching circuit 7.

In the matching circuit 7, an offset value of the offset circuit 71, which is given as an initial setting, is added to the output data from the comparator 6 by the adder 72. If the synthesizer 1 is of such a type that the frequency-dividing ratio of the programmable frequency divider thereof is established by a digital signal, then a digital output signal from the adder 72 is delivered directly to the synthesizer 1 through the switches 74, 75 which have their movable contacts in a lower position in FIG. 5). Conversely, if the synthesizer 1 is of such a type that the frequency-dividing ratio of the programmable frequency divider thereof is established by an analog signal, then a digital output signal from the adder 72 is converted by the D/A converter 73 into an analog signal, which is then delivered to the synthesizer 1 through the switches 74, 75 which have their movable contacts in an upper position in FIG. 5).

The frequency-dividing ratio of the programmable frequency divider of the synthesizer 1 is determined by the output data from the matching circuit 7. The synthesizer 1 then outputs a pilot signal of a new channel (frequency).

The shift register 43 and the EXOR gate 42 jointly serve as a circuit for generating pseudonoise having an optional period depending on the initial setting of the switch circuit 41. The output data from the shift register 43 are used to determine the frequency-dividing ratio of the programmable frequency divider of the synthesizer 1. Therefore, the channel of the synthesizer 1 can be varied at random through a simple arrangement. The pseudonoise generating circuit which employs the shift register 43 and the EXOR gate 42 has a long repetitive rate, and is used to change many channels.

Since the ROM 3 is only required to store data of initial settings for the various circuits, the storage area of the ROM 3 may be much smaller than that of a ROM in the conventional channel selecting systems. Consequently, even if a ROM of a one-chip microcomputer is used as the ROM 3, a large storage area may be assigned to store other programs in the ROM, and hence all control processes can be stored in the ROM without the need for any other ROMs.

2nd Embodiment

FIG. 6 shows in block form a random data generator of a channel selecting system according to a second embodiment of the present invention.

As shown in FIG. 6, a random data generator 8 according to the second embodiment comprises a switch circuit 81, a shift register 83, an AND gate 85 for ANDing output bits from the shift register 83, an OR gate 86 for ORing an output bit from the shift register 83 and an output signal from the AND gate 85, and an EXOR gate 87 for EXORing an output bit from the shift register 83 and an output signal from the OR gate 86. The switch circuit 81 and the shift register 83 are identical respectively to the switch circuit 41 and the shift register 43 shown in FIG. 4. Other details of the channel selecting system according to the second embodiment are identical to those of the selecting system according to the first embodiment.

The AND gate 85, the OR gate 86, and the EXOR gate 87 are combined in a limited configuration which depends on how they are connected to the switches of the switch circuit 81. When the switch circuit 81 and the shift register 83 are initialized, initial settings are selected which correspond to a desired configuration of the AND gate 85, the OR gate 86, and the EXOR gate 87 among certain limited configurations available.

With the arrangement of the random data generator 8, the generating period (repetitive rate) of the pseudonoise produced by the random data generator 8 is shorter than the generating period of the pseudonoise produced by the random data generator 3 according to the first embodiment, and the random data generator 8 produces a reduced number of pseudonoise data.

If the switch circuit 81 comprises 16 switches and is given data "0000000001101010" as an initial setting, then since the highest position of a bit which has been set to "1" is a 7th bit, the generating period (repetitive rate) of the pseudonoise produced by the random data generator 4 according to the first embodiment is $2^7-1=127$.

With the random data generator 8 according to the second embodiment in which the AND gate 85 and the OR gate 86 are connected to an input terminal of the EXOR gate 87 as shown in FIG. 6, the generating period of the pseudonoise produced by the random data generator 8 is 9.

Specifically, if the shift register 83 is given data "0000000001110011" as an initial setting, then the shift register 83 successively outputs data as shown in Table 2 below, one by one according to a control signal from the controller (only low-order 8 bits are shown, and no high-order 8 bits are used in Table 2).

TABLE 2

| 1st pseudonoise (initial setting) | 01110011 |
| 2nd pseudonoise | 01100110 |
| 3rd pseudonoise | 01001100 |
| 8th pseudonoise | 00011100 |
| 9th pseudonoise | 00111001 |
| 10th pseudonoise (same as initial setting) | 01110011 |

The shift register 83, the AND gate 85, the OR gate 86, and the EXOR gate 87 serve as a circuit for generating pseudonoise. The output data from the shift register 83 are used to determine the frequency-dividing ratio of the programmable frequency divider of the synthesizer. Therefore, the channel of the synthesizer can be varied at random through a simple arrangement.

The circuit arrangement according to the second embodiment is used in an application where the repetitive rate is short and it is necessary to select a channel in a wide frequency range.

In the second embodiment, 7th and 6th bits of the shift register 83 are inputted to the AND gate 85, a 4th bit of the shift register 83 and an output signal from the AND gate 85 are inputted to the OR gate 86, can be varied at random through a simple arrangement. and a 2nd bit of the shift register 83 and an output signal from the OR gate 86 are inputted to the EXOR gate 87. However, the connection of the AND gate 85, OR gate 86, and EXOR gate 87 is not limited to the illustrated arrangement insofar as an output signal from the EXOR gate 87 is fed back to the shift register 83. The AND gate 85, OR gate 86, and EXOR gate 87 may each be provided as a certain number of gates, and may each have a certain number of input terminals. The generating pattern and repetitive rate of pseudonoise are determined as desired by a combination of these circuits.

In the logic circuit arrangements according to above embodiments, only the EXOR gate is employed or the AND gate, OR gate, and EXOR gate are used in combination. However, logic circuits used for Boolean logic operations according to the present invention are not limited to the EXOR, AND, and OR gates, but may be EXNOR, NAND, and NOR gates which have an inverting capability. A Boolean function circuit composed of such logic circuits in combination may be implemented by PLD (programmable logic device) or the like.

While preferred embodiments of the present invention have been described using specific terms, such description is for illustrative purposes only, and it is to be understood that changes and variations may be made without departing from the spirit or scope of the following claims.

What is claimed is:

1. A channel selecting system comprising:
   a synthesizer for generating a signal in a predetermined frequency range with established data of a frequency-dividing ratio;
   a random data generator having a shift register having a certain number of output terminals, a switch circuit having a certain number of switches connected respectively to the output terminals of said shift register, and an exclusive-OR gate for exclusive-ORing output signals respectively from said switches and feeding an output signal back to an input terminal of said shift register, to generate data of the frequency-dividing ratio for supplying an output signal from said shift register to randomly select a channel of said synthesizer; and
   a memory for storing initial settings for said shift register and open and closed states of said switches.

2. A channel selecting system comprising:
   a synthesizer for generating a signal in a predetermined frequency range with established data of a frequency-dividing ratio;
   a random data generator having a shift register having a certain number of output terminals, a switch circuit having a certain number of switches connected respectively to the output terminals of said shift register, and an exclusive-NOR gate for exclusive-NORing output signals respectively from said switches and feeding an output signal back to an input terminal of said shift register, to generate data of the frequency-dividing ratio for supplying an output signal from said shift register to randomly select a channel of said synthesizer; and
   a memory for storing initial settings for said shift register and open and closed states of said switches.

3. A channel selecting system comprising:
   a synthesizer for generating a signal in a predetermined frequency range with established data of a frequency-dividing ratio;
   a random data generator having a shift register having a certain number of output terminals, a switch circuit having a certain number of switches connected respectively to the output terminals of said shift register, a Boolean function circuit for being supplied with output signals from said switches, respectively, and an exclusive-OR gate for exclusive-ORing output signals respectively from said switches and an output signal from said Boolean function circuit and feeding an output signal back to an input terminal of said shift register, to generate data of the frequency-dividing ratio for supplying an output signal from said shift register to randomly select a channel of said synthesizer; and a memory for storing initial settings for said shift register and open and closed states of said switches.

4. A channel selecting system comprising:

a synthesizer for generating a signal in a predetermined frequency range with established data of a frequency-dividing ratio;

a random data generator having a shift register having a certain number of output terminals, a switch circuit having a certain number of switches connected respectively to the output terminals of said shift register, a Boolean function circuit for being supplied with output signals from said switches, respectively, and an exclusive-NOR gate for exclusive-NORing output signals respectively from said switches and an output signal from said Boolean function circuit and feeding an output signal back to an input terminal of said shift register, to generate data of the frequency-dividing ratio for supplying an output signal from said shift register to randomly select a channel of said synthesizer; and a memory for storing initial settings for said shift register and open and closed states of said switches.

5. The channel selecting system according to claims 1, further comprising:

a comparator for deciding whether an oscillating frequency of said synthesizer falls in a predetermined frequency range or not, based on output data from said random data generator;

a matching circuit for adding a predetermined offset value to output data from said comparator, and outputting a sum signal as either a digital signal or an analog signal to said synthesizer; and a controller for initializing said switch circuit, said shift register, said comparator, and said matching circuit with the initial settings stored in said memory, and supplying a control signal to said random data generator to generate the next data of the frequency-dividing ratio in response to a channel change request;

wherein said memory stores data, as the initial setting for said comparator, for deciding whether the oscillating frequency of said synthesizer falls in a predetermined frequency range or not, and said offset value as the initial setting for said matching circuit.

6. The channel selecting system according to claims 2, further comprising:

a comparator for deciding whether an oscillating frequency of said synthesizer falls in a predetermined frequency range or not, based on output data from said random data generator;

a matching circuit for adding a predetermined offset value to output data from said comparator, and outputting a sum signal as either a digital signal or an analog signal to said synthesizer; and a controller for initializing said switch circuit, said shift register, said comparator, and said matching circuit with the initial settings stored in said memory, and supplying a control signal to said random data generator to generate the next data of the frequency-dividing ratio in response to a channel change request;

wherein said memory stores data, as the initial setting for said comparator, for deciding whether the oscillating frequency of said synthesizer falls in a predetermined frequency range or not, and said offset value as the initial setting for said matching circuit.

7. The channel selecting system according to claims 3, further comprising:

a comparator for deciding whether an oscillating frequency of said synthesizer falls in a predetermined frequency range or not, based on output data from said random data generator;

a matching circuit for adding a predetermined offset value to output data from said comparator, and outputting a sum signal as either a digital signal or an analog signal to said synthesizer; and a controller for initializing said switch circuit, said shift register, said comparator, and said matching circuit with the initial settings stored in said memory, and supplying a control signal to said random data generator to generate the next data of the frequency-dividing ratio in response to a channel change request;

wherein said memory stores data, as the initial setting for said comparator, for deciding whether the oscillating frequency of said synthesizer falls in a predetermined frequency range or not, and said offset value as the initial setting for said matching circuit.

8. The channel selecting system according to claims 4, further comprising:

a comparator for deciding whether an oscillating frequency of said synthesizer falls in a predetermined frequency range or not, based on output data from said random data generator;

a matching circuit for adding a predetermined offset value to output data from said comparator, and outputting a sum signal as either a digital signal or an analog signal to said synthesizer; and a controller for initializing said switch circuit, said shift register, said comparator, and said matching circuit with the initial settings stored in said memory, and supplying a control signal to said random data generator to generate the next data of the frequency-dividing ratio in response to a channel change request;

wherein said memory stores data, as the initial setting for said comparator, for deciding whether the oscillating frequency of said synthesizer falls in a predetermined frequency range or not, and said offset value as the initial setting for said matching circuit.

* * * * *